United States Patent
Mattes

(10) Patent No.: US 6,326,717 B1
(45) Date of Patent: Dec. 4, 2001

(54) PIEZOELECTRIC ACTUATOR

(75) Inventor: Patrick Mattes, Stuttgart (DE)

(73) Assignee: Robert Bosch GmbH

( * ) Notice: Subject to any disclaimer, the term of this patent is extended or adjusted under 35 U.S.C. 154(b) by 0 days.

(21) Appl. No.: 09/673,350

(22) PCT Filed: Dec. 16, 1999

(86) PCT No.: PCT/DE99/03999

§ 371 Date: Dec. 29, 2000

§ 102(e) Date: Dec. 29, 2000

(87) PCT Pub. No.: WO00/49666

PCT Pub. Date: Aug. 24, 2000

(30) Foreign Application Priority Data

Feb. 16, 1999 (DE) ............................................. 199 06 468

(51) Int. Cl.$^7$ .............................. H01L 41/04; H01L 41/08
(52) U.S. Cl. ................................................................. 310/328
(58) Field of Search ................................................ 310/328

(56) References Cited

U.S. PATENT DOCUMENTS 5,359,252 * 10/1994 Swift et al. ........................... 310/328

FOREIGN PATENT DOCUMENTS

19650900 * 6/1998 (DE) .
19653555 * 6/1998 (DE) .

* cited by examiner

Primary Examiner—Mark Budd
Assistant Examiner—Vinod M. Patel
(74) Attorney, Agent, or Firm—Ronald E. Greigg

(57) ABSTRACT

A piezoelectric actuator, in particular for actuating control valves or injection valves in motor vehicles, having an actuator body embodied in the form of a multilayered laminate made up of stacked layers of piezoelectric material with intervening metallic or electrically conductive layers that function as electrodes. The piezoelectric actuator include end faces, between a bottom plate oriented toward the valve and an opposing top plate, which are elastically prestressed by two spring bands that are disposed in the longitudinal direction on opposite sides of the actuator body and whose prestressing force can be adjusted by an adjusting nut. The piezoelectric actuator is constituted so that the adjusting nut engages in screw fashion with an external thread provided on a central, axial extension bolt of the top plate and which, depending on a screwed position, adjusts the prestressing force of the spring bands.

14 Claims, 2 Drawing Sheets

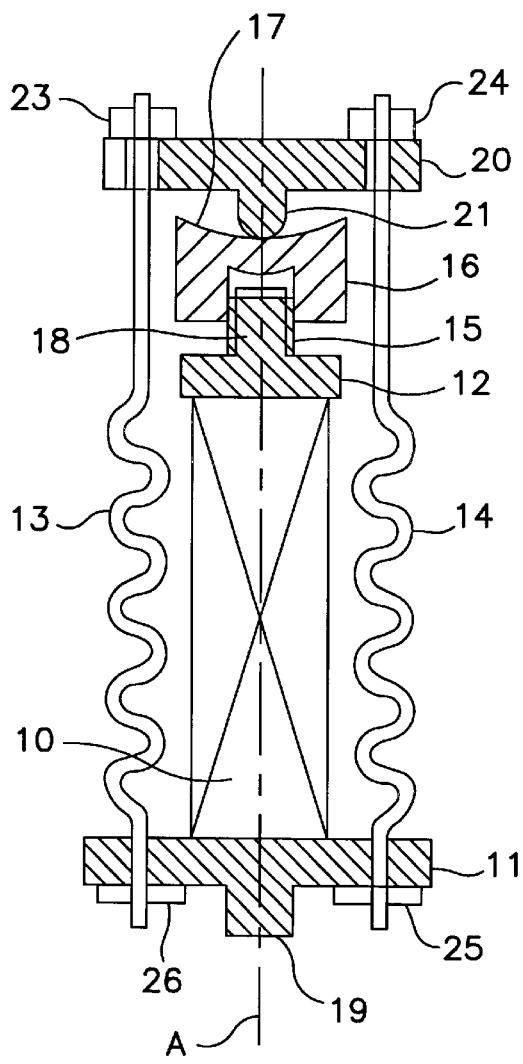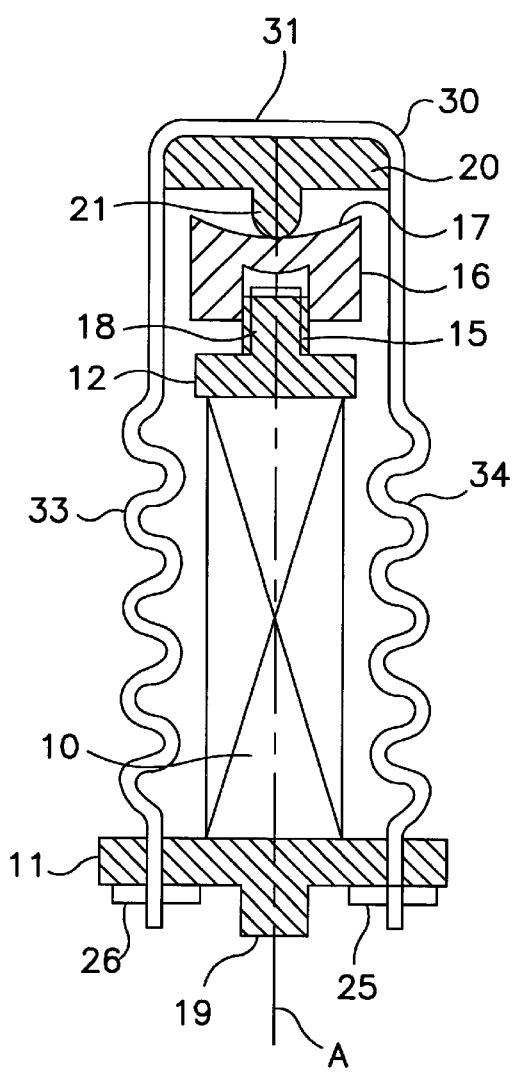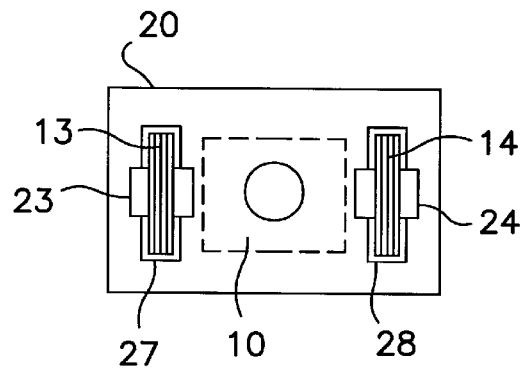
FIG. 2A
FIG. 3
FIG. 2B

PIEZOELECTRIC ACTUATOR

CROSS REFERENCES TO RELATED APPLICATIONS

This is a 35 USC 371 application of PCT/DE 99/03999 filed on Dec. 16, 1999.

PRIOR ART

The invention relates to a piezoelectric actuator, in particular for actuating control valves or injection valves in motor vehicles, having an actuator body in the form of a multilayered laminate made up of stacked layers of piezoelectric material with intervening metallic or electrically conductive layers that function as electrodes. The actuator body, on its end faces between a bottom plate oriented toward the valve and a top plate on the opposite end, is elastically prestressed by means of two spring bands that are disposed in the longitudinal direction on opposite sides of the actuator body in which the prestressing force can be adjusted by adjusting means.

A piezoelectric actuator of this kind has been disclosed, for example, by DE 196 50 900 A1 from Robert Bosch GmbH. A multilayered piezoelectric actuator of this kind, embodied in the form of a laminated stack of piezoelectric layers with intervening electrode layers, must be installed under an initial stress since otherwise, it would tear apart when actuated. The order of magnitude of this initial stress depends on the triggering speed and the dimensions of the actuator body. Depending on the embodiment of the piezoelectric actuator body, the initial stress force is 500–1000 N.

The accompanying FIG. 1 shows a piezoelectric actuator known from the above-mentioned reference, which has a multilayered actuator body 3. During the manufacture of the known piezoelectric actuator, the end faces of the actuator body 3 are respectively glued to a bottom plate 7 and a covering plate 8. The required initial stress is exerted by spring bands 4a and 4b, which are disposed in the longitudinal direction in relation to the two sides of the actuator body 3. In order to compensate for the tolerances occurring due to manufacturing imprecisions in the production of the actuator body, high precision compensation disks 1, 2, & 5 are required. Maintaining a supply of compensation disks and the installation of the disks increases the manufacturing costs of the piezoelectric actuator.

OBJECT AND ADVANTAGES OF THE INVENTION

An object of the invention is to produce a cheaper-to-manufacture piezoelectric multilayered actuator with improved adjusting and compensating elements, which can be used to arbitrarily adjust or readjust the prestressing force exerted on the actuator body by the spring bands.

As in the known embodiment, the actuator body is elastically prestressed by means of spring bands lying laterally across the actuator body. In contrast to the known embodiment, however, the spring force is adjusted by turning an adjusting nut.

A compensation rocker, which engages centrally on a concave recess of the adjusting nut, serves to prevent a unilateral introduction of force as a result of tolerance-encumbered spring bands and has an axially protruding centering bolt whose spherical contour can move on the concave recess of the adjusting nut. As a result, when the adjusting nut is turned, the initial stress is uniformly exerted, i.e. in a centered fashion. Tolerances in the spring rigidities are compensated for by a tilting of the compensation rocker. In this way, arbitrary prestressing forces in a desired force range can be smoothly adjusted or readjusted during the service life of the piezoelectric actuator or the valve that is equipped with the prestressing force. Simultaneously, the assembly is simplified and is made less expensive since a correction with the adjusting nut only has to be carried out at one location.

With the embodiment according to the invention of a piezoelectric actuator, the following advantages in particular are achieved:

A unilateral introduction of force is prevented through the use of the compensation rocker. This means that the piezoelectric actuator has a longer service life because the probability of fracture formations is reduced.

Through the use of prefabricated parts and the force adjustment at a single location, i.e. at the adjusting nut, the assembly of the piezoelectric actuator is simplified and therefore less expensive.

The prestressing force can be readjusted during the service life of the piezoelectric actuator. This advantageously takes into account a fatigue of the spring bands producing the prestressing force.

The above features and advantages of the piezoelectric actuator according to the invention will be clarified further by the following description of two exemplary embodiments when taken in conjunction with the accompanying drawings.

BRIEF DESCRIPTION OF THE DRAWINGS

FIGS. 2A & 2B are a schematic longitudinal section and a top view of the tope side of a preferred exemplary embodiment according to the invention of a piezoelectric actuator, and FIG. 3 is a schematic longitudinal section through another exemplary embodiment according to the invention of a piezoelectric actuator.

DESCRIPTION OF THE EXEMPLARY EMBODIMENTS

Figure 1:
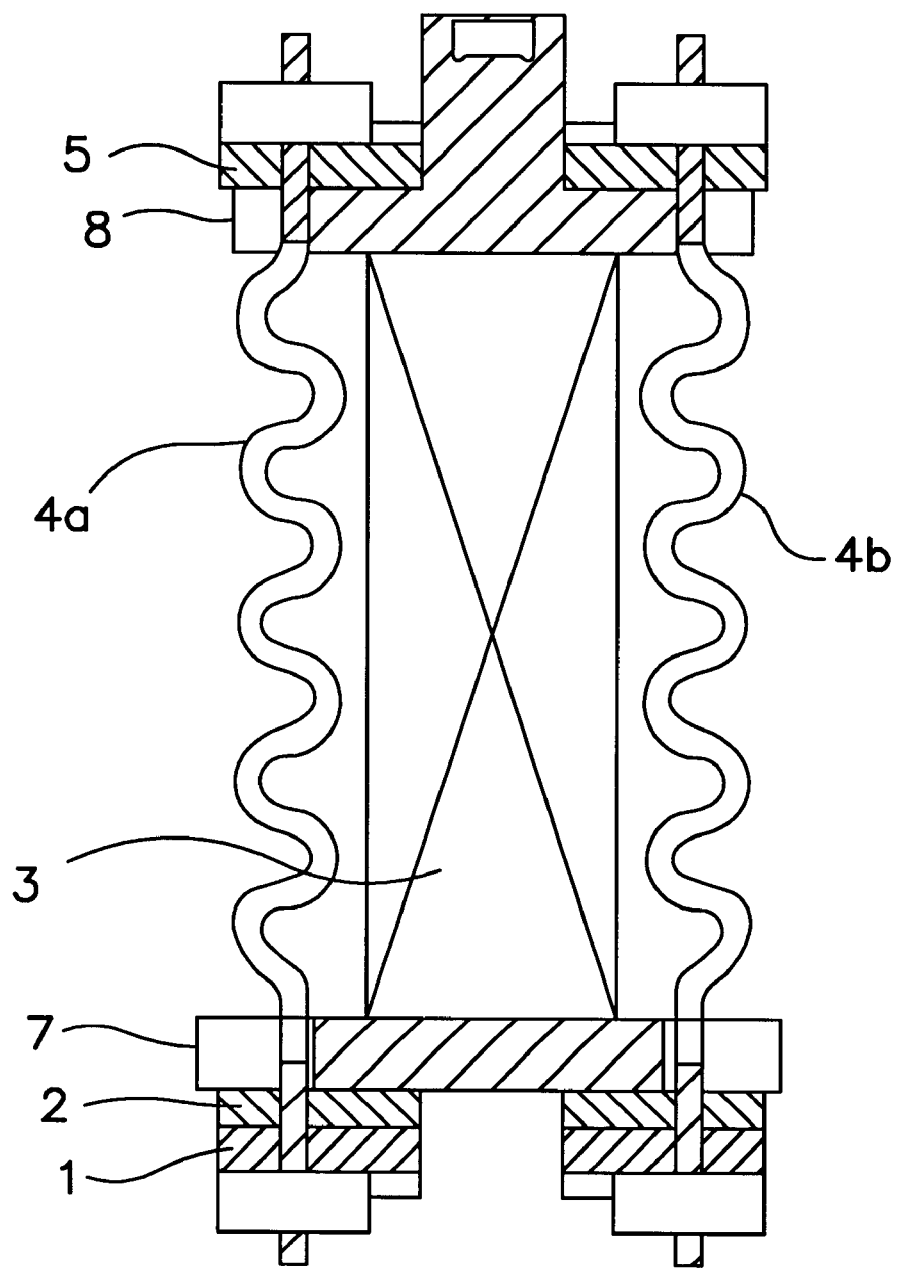
FIG. 1 is a schematic longitudinal section through the above-describe known piezoelectric actuator.

According to FIG. 2A, which is a schematic longitudinal section through a preferred exemplary embodiment of a piezoelectric actuator according to the invention, a multi-layered actuator body 10, which is comprised of a multi-layered laminate made up of stacked layers of piezoelectric material with intervening metallic or electrically conductive layers that function as electrodes, is elastically prestressed on its end faces between a bottom plate 11 oriented toward the valve. The bottom plate has a central pressure tappet 19 that protrudes axially toward the valve (not shown), and an opposing top plate 12 by means which the multilayer actuator body is prestressed by two separate spring bands 13 and 14 extending in the longitudinal direction of the actuator body.

If a pulsating electrical voltage is applied to the electrodes (not shown) of the actuator body 10, the actuator body executes analogously pulsating strokes by changing the distance between the end faces that are prestressed by the spring bands 13 and 14. As a result, the bottom plate 11 with the pressure tappet 19 moves in the axial direction counter to the spring force exerted by the spring bands 13 and 14. The top plate 12 has an axial extension bolt provided with an external thread 15. The internal thread of an adjusting nut 16 engages with the external thread 15 of the extension bolt 18. The spring force of the two spring bands 13 and 14 can be adjusted by rotating the adjusting nut 16.

In the exemplary embodiment shown in FIG. 2A, adjustment takes place by virtue of the fact that the adjusting nut 16 acts on a connecting element embodied as a compensation rocker 20 which, with the aid of fixing pins 23 and 24 that are inserted through bores at the upper end of the two spring bands 13 and 14, connects the two spring bands 13 and 14 so that a certain play remains for tilting the compensation rocker 20. In order to balance and center the prestressing force exerted by the adjusting nut 16 on the two spring bands 13 and 14, the compensation rocker 20 has a centering bolt 21, which protrudes centrally in the axial direction toward the adjusting nut 16 and has a spherical end, which can move in a centered fashion on a concave centering surface 17 of the adjusting nut 16. The radius of this concave centering surface 17 is significantly greater than the radius at the end of the centering bolt 21 of the compensation rocker 20. In this manner, and through the selected axial length of the centering bolt 21, room for play remains between the top outer edge of the adjusting nut 16 and the underside of the compensation rocker so that the compensation rocker 20 can tilt slightly. In this manner, tolerances in the spring rigidities of the spring bands 13 and 14 are compensated for by a tilting of the compensation rocker so that with rotation of the adjusting nut 16, the initial stress acts on the end faces of the actuator body 10 uniformly and in the axial direction. Consequently, arbitrary prestressing forces can be smoothly adjusted or readjusted during the service life of the piezoelectric actuator and the valve that is equipped with it. Simultaneously, the assembly is simplified since a correction only has to be carried out at one location, i.e. at the adjusting nut 16, and no high precision compensation disks are required for adjusting the prestressing force.

As shown in particular in the top view in FIG. 2B of the piezoelectric actuator depicted in FIG. 2A, the bores 27 and 28 provided in the compensation rocker 20 are embodied in such a way that the spring bands 13 and 14 rest in them with play. The fixing of the spring bands 13 and 14 is carried out during assembly by means of fixing pins 23 and 24 which are slid through bores at the upper end section of the spring bands 13 and 14. The fixing pins 23 and 24 can be provided with an indentation or with annular grooves so that the pins 23 and 24 rest securely in the bores of the spring bands 13 and 14 and cannot fall out during operation of the piezoelectric actuator.

In the form of a schematic longitudinal section, FIG. 3 shows a second exemplary embodiment of a piezoelectric actuator according to the invention. In this case, separate spring bands 33 and 34 are provided, but the prestressing element is a single spring bracket 30 curved into a U-shape, whose long legs constitute two opposing spring bands 33 and 34 on the longitudinal sides of the actuator body 10. The prestressing force is adjusted in precisely the same manner as in the exemplary embodiment shown in FIG. 2A, with the aid of an adjusting nut 16, whose internal thread engages the external thread 15 of the axially protruding extension bolt 18 of the top plate 12, as a result of which the prestressing force acting on the end faces of the actuator body 10 is adjusted by means of a single adjusting mechanism, namely by turning the adjusting nut 16. The flat bottom part 31 of the spring bracket 30 is guided by means of a compensation rocker 20 which, as regards the centering bolt 21, can have the same form as the compensation rocker 20 according to FIG. 2A. In addition, the compensation rocker 20 shown in FIG. 3 can have a recess or groove in its top side, not shown in FIG. 3, in which the flat bottom part 31 of the spring bracket 30 rests.

Also in the exemplary embodiment shown in FIG. 3, the adjusting nut 16 advantageously has a central, concave centering surface 17 in which the centering bolt 21 of the compensation rocker 20 can move.

It should also be mentioned that the two exemplary embodiments according to the invention are fundamentally suitable for a round, rectangular, or square cross-sectional form of the actuator body.

The foregoing relates to a preferred exemplary embodiments of the invention, it being understood that other variants and embodiments thereof are possible within the spirit and scope of the invention, the latter being defined by the appended claims.

What is claimed is:

1. A piezoelectric actuator for actuating control valves or injection valves in motor vehicles, comprising an actuator body (10) in the form of a multilayered laminate made up of stacked layers of piezoelectric material with intervening metallic or electrically conductive layers that function as electrodes, which, the actuator body includes end faces between a bottom plate (11) oriented toward the valve and an opposing top plate (12), the end faces are elastically prestressed by means of two spring bands (13, 14; 33, 34) that are disposed in a longitudinal direction on opposite sides of the actuator body, the prestressing force of the springs is adjusted by adjusting means, the adjusting means includes an adjusting nut (16), which engages with an external thread (15) provided on a central, axial extension bolt (18) of the top plate (12) and which, depending on a screwed position of the adjusting nut, adjusts the prestressing force of the spring bands (13, 14; 33, 34).

2. The piezoelectric actuator according to claim 1, in which the spring bands (33, 34) includes parallel legs of a single, approximately U-shaped spring bracket (30), whose base engages the adjusting nut (16).

3. The piezoelectric actuator according to claim 1, in which the spring bands (13, 14) are two separate bands which are connected in a frictionally engaging manner by means of a connecting element which is disposed outside the adjusting nut (16) and is acted on by the adjusting nut (16) in a prestressing manner.

4. The piezoelectric actuator according to claim 3, in which the connecting element constitutes a tiltable compensation rocker (20) that centers the prestressing force, which is exerted by the spring bands (13, 14) and adjusted by the adjusting nut, onto a longitudinal axis (A) of the actuator body (10).

5. The piezoelectric actuator according to claim 4, in which the compensation rocker (20) has a central centering bolt (21) which protrudes axially toward the adjusting nut (16), which rests against an outer end wall of the adjusting nut (16), and whose end has a spherical contour.

6. The piezoelectric actuator according to claim 5, in which the external end wall of the adjusting nut (16) constitutes a central, concave centering surface (17) whose radius is significantly greater than that of the centering bolt (21) of the compensation rocker (20) resting in the centering socket.

7. The piezoelectric actuator according to claim 3, in which the spring bands (13, 14) have bores on their end sections and are fixed to the respective connecting element or the compensation rocker (20) and the bottom plate (11) with fixing pins (23, 24, 25, 26) that are slid through the bores.

8. The piezoelectric actuator according to 4, in which the spring bands (13, 14) have bores on their end sections and are fixed to the respective connecting element or the compensation rocker (20) and the bottom plate (11) with fixing pins (23, 24, 25, 26) that are slid through the bores.

9. The piezoelectric actuator according to 5, in which the spring bands (13, 14) have bores on their end sections and are fixed to the respective connecting element or the compensation rocker (20) and the bottom plate (11) with fixing pins (23, 24, 25, 26) that are slid through the bores.

10. The piezoelectric actuator according to 6, in which the spring bands (13, 14) have bores on their end sections and are fixed to the respective connecting element or the compensation rocker (20) and the bottom plate (11) with fixing pins (23, 24, 25, 26) that are slid through the bores.

11. The piezoelectric actuator according to claim 7, in which the fixing pins (23–26) are provided with an indentation or circumferential groove which is engaged in a form-fitting manner by the end sections of the spring bands (13, 14).

12. The piezoelectric actuator according to claim 4, in which the fixing pins (23–26) are provided with an indentation or circumferential groove which is engaged in a form-fitting manner by the end sections of the spring bands (13, 14).

13. The piezoelectric actuator according to claim 5, in which the fixing pins (23–26) are provided with an indentation or circumferential groove which is engaged in a form-fitting manner by the end sections of the spring bands (13, 14).

14. The piezoelectric actuator according to claim 6, in which the fixing pins (23–26) are provided with an indentation or circumferential groove which is engaged in a form-fitting manner by the end sections of the spring bands (13, 14).

* * * * *